United States Patent
Lee et al.

(10) Patent No.: US 8,524,538 B2
(45) Date of Patent: Sep. 3, 2013

(54) INTEGRATED CIRCUIT PACKAGING SYSTEM WITH FILM ASSISTANCE MOLD AND METHOD OF MANUFACTURE THEREOF

(75) Inventors: JaeHyun Lee, Sungnam (KR); Ki Youn Jang, Ichon-si (KR); DokOk Yu, Seoul (KR)

(73) Assignee: Stats Chippac Ltd., Singapore (SG)

( * ) Notice: Subject to any disclaimer, the term of this patent is extended or adjusted under 35 U.S.C. 154(b) by 74 days.

(21) Appl. No.: 13/327,091

(22) Filed: Dec. 15, 2011

(65) Prior Publication Data

US 2013/0154121 A1   Jun. 20, 2013

(51) Int. Cl.
*H01L 23/48* (2006.01)
*H01L 23/52* (2006.01)
*H01L 29/40* (2006.01)
*H01L 21/00* (2006.01)

(52) U.S. Cl.
USPC .......................... 438/115; 438/127; 257/778

(58) Field of Classification Search
USPC ................... 438/115, 127; 257/778
See application file for complete search history.

(56) References Cited

U.S. PATENT DOCUMENTS

| | | | |
|---|---|---|---|
| 5,450,283 | A | 9/1995 | Lin et al. |
| 6,699,731 | B2 | 3/2004 | Huang et al. |
| 7,138,706 | B2 * | 11/2006 | Arai et al. ..................... 257/678 |
| 7,190,067 | B2 * | 3/2007 | Chen et al. ..................... 257/706 |
| 7,371,618 | B2 | 5/2008 | Yoon |
| 7,514,300 | B2 * | 4/2009 | Lebonheur et al. ........... 438/127 |
| 7,880,317 | B2 | 2/2011 | Ohde et al. |
| 2005/0082690 | A1 * | 4/2005 | Hayashi et al. ............... 257/788 |
| 2007/0296079 | A1 * | 12/2007 | Huang et al. .................. 257/712 |
| 2009/0206519 | A1 | 8/2009 | Hou |
| 2010/0038780 | A1 | 2/2010 | Daubenspeck et al. |

FOREIGN PATENT DOCUMENTS

KR   1020090081038 A   7/2009

* cited by examiner

*Primary Examiner* — Fernando L Toledo
*Assistant Examiner* — Karen Kusumakar
(74) *Attorney, Agent, or Firm* — Ishimaru & Associates LLP

(57) ABSTRACT

A method of manufacture of an integrated circuit packaging system includes: providing a substrate; mounting an integrated circuit over the substrate, the integrated circuit having an inactive side and a non-horizontal side; mounting a mold chase having a buffer layer over the integrated circuit; forming an encapsulation between the substrate and the buffer; and removing the mold chase, leaving the encapsulation having a recess exposing a portion of the non-horizontal side.

20 Claims, 5 Drawing Sheets

INTEGRATED CIRCUIT PACKAGING SYSTEM WITH FILM ASSISTANCE MOLD AND METHOD OF MANUFACTURE THEREOF

TECHNICAL FIELD

The present invention relates generally to an integrated circuit packaging system, and more particularly to an integrated circuit packaging system with a recess in an encapsulation.

BACKGROUND ART

Modern electronics, such as smart phones, cell phones, digital cameras, personal digital assistants, location based services devices, and enterprise class appliances, are packing more integrated circuits into an ever shrinking physical space with expectations for decreasing cost. As more functions are packed into the integrated circuits and more integrated circuits into the package, integrated circuit packages must continue to provide a mechanism for making electrical interconnection between the integrated circuit die and the leads that are utilized to make electrical interconnections to circuits, power, and ground external to the integrated circuit die. In the early stages of integrated circuit development, there were relatively few connections between the integrated circuit die and the external circuitry.

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance. Different challenges arise from increased functionality integration and miniaturization.

Thus, a need still remains for an integrated circuit packaging system including high input/output density, low cost, and improved reliability. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; mounting an integrated circuit over the substrate, the integrated circuit having an inactive side and a non-horizontal side; mounting a mold chase having a buffer layer over the integrated circuit; forming an encapsulation between the substrate and the buffer; and removing the mold chase, leaving the encapsulation having a recess exposing a portion of the non-horizontal side.

The present invention provides an integrated circuit packaging system, including: a substrate; an integrated circuit over the substrate, the integrated circuit having an inactive side and a non-horizontal side; and an encapsulation on the integrated circuit and the substrate, the encapsulation having a recess exposing a portion of the non-horizontal side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
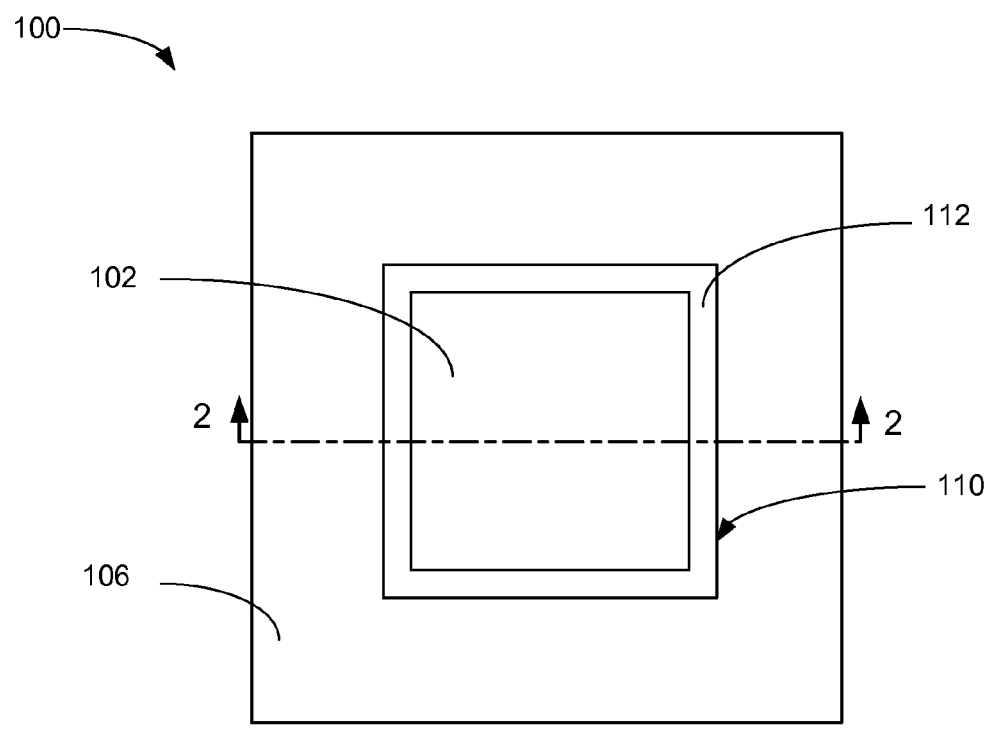
FIG. 1 is a top view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the active side of the integrated circuit, regardless of its orientation. The term "vertical" refers to a direction perpendicular to the horizontal as just defined. Terms, such as "above", "below", "bottom", "top", "side", "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in an embodiment of the present invention. The integrated circuit packaging system 100 can include an integrated circuit 102, which is defined as the chip with active circuitry fabricated thereon. For example, the integrated circuit 102 can include a flip chip, a wire bonded chip, or a packaged integrated circuit.

The integrated circuit packaging system 100 can include an encapsulation 106. The encapsulation 106 is defined as a cover surrounding and protecting the contents in the integrated circuit packaging system 100 from the environment and hermetically seals the contents internal to the integrated circuit packaging system 100. The encapsulation 106 can include an epoxy molding, resin, protective molding, or encasement structure.

The encapsulation 106 can include a recess 110, which is defined as an indentation from a top extent of the encapsulation 106. For example, the recess 110 can surround the integrated circuit 102. For further example, the encapsulation 106 can include the recess 110 with a recess surface 112. The recess surface 112 is defined as a side of the encapsulation 106 exposed by the recess 110.

Figure 2:
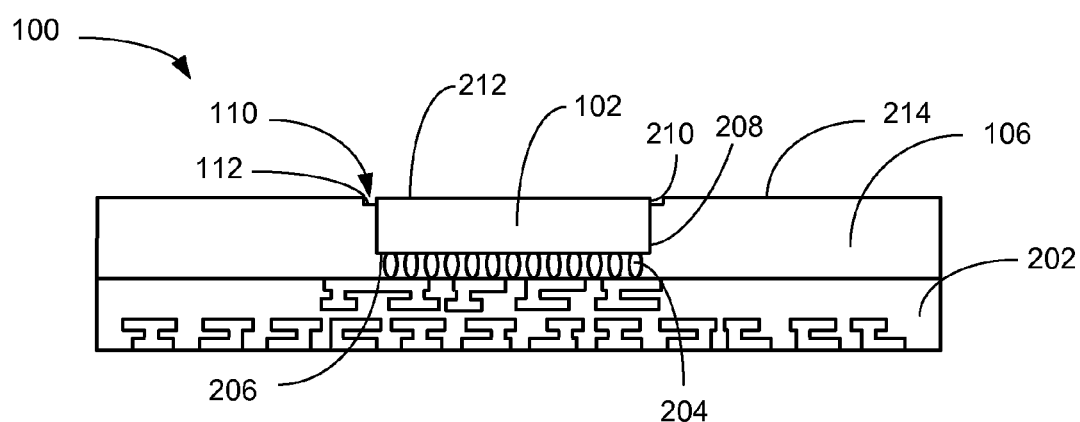
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The integrated circuit packaging system 100 can include a substrate 202. The substrate 202 is defined as a mounting structure for an integrated circuit or other electrical components as well as providing electrical connections between, to, and from the devices mounted thereto.

The integrated circuit 102 can include a conductive connector 204 on a lower active side 206 of the integrated circuit 102. The conductive connector 204 is defined as a connection interface for electrical connection to other components. For example, the conductive connector 204 can include a solder bump or a conductive bump.

The lower active side 206 is defined as a side of the integrated circuit 102 having active circuitry. For example, the integrated circuit 102 can represent the flip chip having the lower active side 206 facing the substrate 202. For another example, the integrated circuit 102 can have an inactive side 212.

The integrated circuit 102 can be mounted over the substrate 202. The integrated circuit 102 can have the inactive side 212 and a non-horizontal side 208. For example, the non-horizontal side 208 can represent the side of the integrated circuit 102 perpendicular to a top surface of the substrate 202.

The encapsulation 106 can be formed on the integrated circuit 102, exposing the inactive side 212 of the integrated circuit 102. For example, the encapsulation 106 can expose the inactive side 212 of the integrated circuit 102. The encapsulation 106 can include a topside 214. For example, the topside 214 of the encapsulation 106 can be coplanar with the inactive side 212 of the integrated circuit 102.

For further example, the encapsulation 106 can expose a portion 210 of the non-horizontal side 208 of the integrated circuit 102. The portion 210 is defined as the non-horizontal side 208 exposed within the recess 110. For further example, the portion 210 is adjacent to the inactive side 212 of the integrated circuit 102. The portion 210 is adjacent to the recess surface 112.

It has been discovered that integrated circuit 102 encapsulated by the encapsulation 106 having the recess 110 can prevent mold flash, thus, improving the reliability of the integrated circuit packaging system 100. The mold flash can cause the material of the encapsulation 106, such as the resin, to bleed over the integrated circuit 100. Thus, having the recess 110 can prevent the material of the encapsulation 106 from bleeding over the integrated circuit 102.

It has been further discovered that the prevention of mold flash can improve the reliability of the integrated circuit package system 100 by allowing an even formation of the encapsulation 106, resulting in an even heat distribution across the integrated circuit 100 and the encapsulation 106. Additionally, the prevention of mold flash can lead to avoidance of mislabeling of the integrated circuit packaging system 100, as the material of the encapsulation 106 does not smear the inactive side 212 of the integrated circuit 102.

It has been also discovered that the prevention of the mold flash can improve the reliability of the integrated circuit packaging system 100 by avoiding a contamination of the inactive side 212 of the integrated circuit 102. Other components, such as a heat sink (not shown), can be mounted over the inactive side 212. And the performance of the integrated circuit 102 can be lowered if the heat sink is attached to the inactive side 212 that has been contaminated by the mold flash. As a result, the film assisted molding design of the present invention can be applied to various semiconductors, thus, lowering the production cost.

Figure 3:
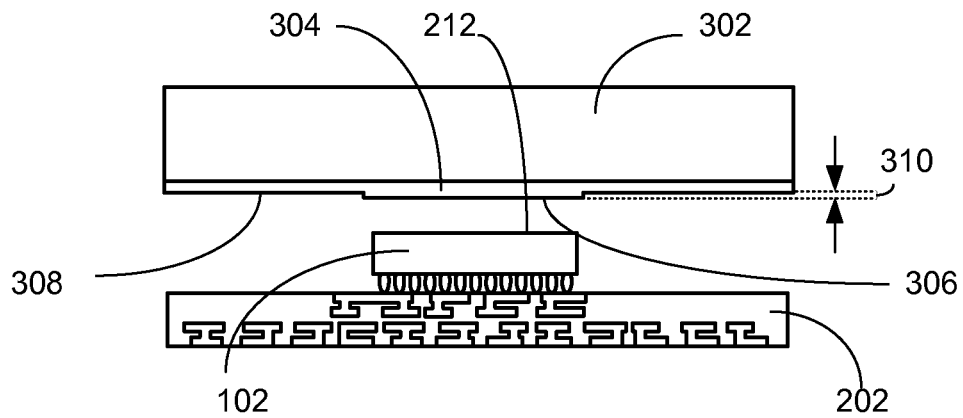
FIG. 3 is a cross-sectional view of the integrated circuit over the substrate for manufacture of the integrated circuit packaging system of FIG. 1 after a mounting phase of the first manufacture.

Referring now to FIG. 3, therein is shown a cross-sectional view of the integrated circuit 102 over the substrate 202 for manufacture of the integrated circuit packaging system 100 of FIG. 1 after a mounting phase of the first manufacture. A mold chase 302 having a buffer layer 304 can be mounted over the integrated circuit 102. The buffer layer 304 is defined as a layer attached on the mold chase 302 to prevent mold flash when forming the encapsulation 106 of FIG. 1 over the integrated circuit 102. For example, the buffer layer 304 can include an assisted film or an adhesive. For further example, the buffer layer 304 can include acrylic resin, polymer material, or a combination thereof.

The buffer layer 304 can include a step layer 306 and a base layer 308. The step layer 306 is defined as an area of the buffer layer 304 located over the inactive side 212 of the integrated circuit 102. For example, the buffer layer 304 can be applied with the step layer 306 having a wider surface area than the inactive side 212. For further example, a thickness of the step layer 306 can be thicker than a thickness of the base layer 308. The difference in the thickness of the step layer 306 and the base layer 308 can be represented as a step height 310.

Figure 4:
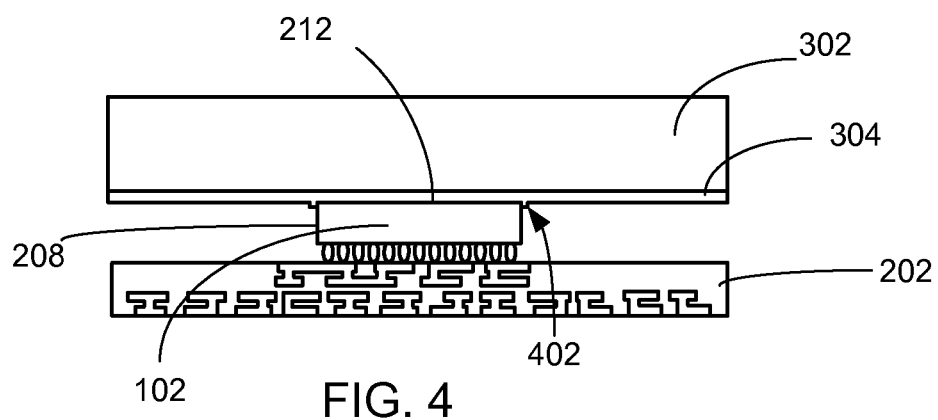
FIG. 4 is a cross-sectional view of the integrated circuit over the substrate for manufacture of the integrated circuit packaging system of FIG. 1 after a mounting phase of the first manufacture.

Referring now to FIG. 4, therein is shown a cross-sectional view of the integrated circuit 102 over the substrate 202 for manufacture of the integrated circuit packaging system 100 of FIG. 1 after a mounting phase of the first manufacture. A barrier 402 can be formed after the mold chase 302 with the buffer layer 304 being pressed down on to the inactive side 212 of the integrated circuit 102. More specifically, the barrier 402 can be formed when the step layer 306 of FIG. 3 of the buffer layer 304 is pressed against the inactive side 212 of the integrated circuit 102. For further example, the barrier 402 can be applied to directly contact to cover the portion 210 of FIG. 2 of the non-horizontal side 208 of the integrated circuit 102. For another example, the barrier 402 can include a width with an approximate range of 10 to 100 micrometers (um) and a height with an approximate range of 5 to 50 um.

It has been discovered that the manufacture of the integrated circuit packaging system 100 with the mode chase 302 having the buffer layer 304 can reduce the profile of the semiconductor device. The mode chase 302 having the buffer layer 304 can prevent the encapsulation 106 of FIG. 1 over the inactive side 212, thus, reducing the profile. As a result, the lower profile allows the ability to stack another device over the integrated circuit packaging system 100, thus, lowering the production cost.

It has been also discovered that the manufacture of the integrated circuit packaging system 100 with the mode chase 302 having the buffer layer 304 can enable the scanning acoustic tomographic inspection easier. The mode chase 302 having the buffer layer 304 can prevent the formation of the encapsulation 106 over the inactive side 212, thus, preventing the formation of an interruption layer over the integrated circuit 102. As a result, the lack of interruption layer allows an easier inspection, thus, lowering the production cost.

It has been further discovered that the manufacture of the integrated circuit packaging system 100 with the mode chase4 302 having the buffer layer with the barrier 402 can prevent the material of the encapsulation 106 from contaminating the inactive side 212. The mold flash can cause the material of the encapsulation 106, such as the resin, to bleed over the integrated circuit 100. Thus, having the barrier 402 can prevent the material of the encapsulation 106 from bleeding over the integrated circuit 102. As a result, the film assisted molding design of the present invention can be applied to various semiconductors, thus, lowering the production cost.

Figure 5:
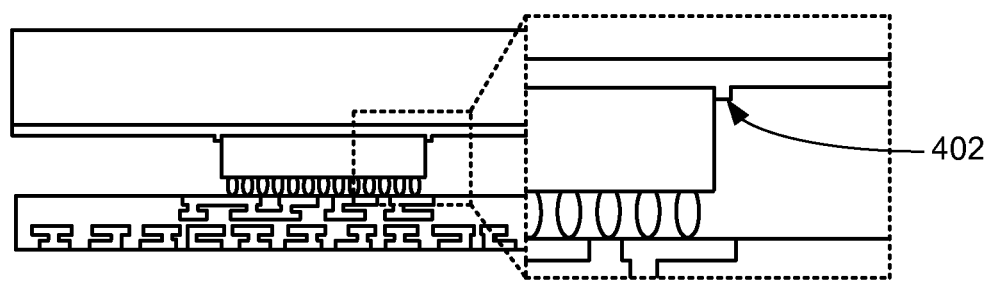
FIG. 5 is an expanded view of the barrier of FIG. 4.

Referring now to FIG. 5, therein is shown an expanded view of the barrier 402 of FIG. 4. The expanded view can be illustrated within the dotted lines. For example, the thickness of the step layer 306 of FIG. 3 and the thickness of the base layer 308 of FIG. 3 can be the same.

For further example, a height of the barrier 402 extending from the base layer 402 can be less than the thickness of the base layer 308. For another example, a non-horizontal side of the barrier 402 facing the integrated circuit 102 of FIG. 1 can directly contact the portion 210 of the integrated circuit 102.

Figure 6:
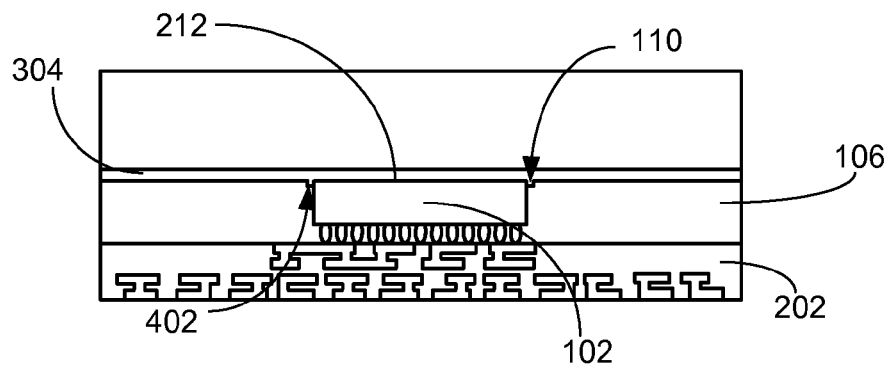
FIG. 6 is a cross-sectional view of the integrated circuit over the substrate for manufacture of the integrated circuit packaging system of FIG. 1 during a mold phase of the first manufacture.

Referring now to FIG. 6, therein is shown a cross-sectional view of the integrated circuit 102 over the substrate 202 for manufacture of the integrated circuit packaging system 100 of FIG. 1 during a mold phase of the first manufacture. The encapsulation 106 can be formed between the substrate 202 and the buffer layer 304. The encapsulation 106 contacting the barrier 402 can form the recess 110.

It has been discovered that the barrier 402 formed directly contacting the portion 210 of FIG. 1 of the non-horizontal side 208 FIG. 1 of the integrated circuit 102 can prevent mold flash during a formation of the encapsulation 106. More specifically, the barrier 402 can prevent the material of the encapsulation 106 from bleeding over on to the inactive side 212 of the integrated circuit 102.

Further, the prevention of mold flash can improve the reliability by allowing an even formation of the encapsulation 106, resulting in an even heat distribution across the integrated circuit 102 and the encapsulation 106. Additionally, the prevention of mold flash can lead to avoidance of mislabeling of the integrated circuit packaging system 100, as the material of the encapsulation 106 does not smear the inactive side 212 of the integrated circuit 102.

Furthermore, the prevention of the mold flash can improve the reliability of the integrated circuit packaging system 100 by avoiding a contamination of the inactive side 212 of the integrated circuit 102. Other components, such as the heat sink (not shown), can be mounted over the inactive side 212. And the performance of the integrated circuit 102 can be lowered if the heat sink is attached to the inactive side 212 that has been contaminated by the mold flash. As a result, the film assisted molding design of the present invention can be applied to various semiconductors, thus, lowering the production cost.

It has also been discovered that the barrier 402 can reduce the stress on the integrated circuit 102 during the formation of the encapsulation 106. Moreover, the barrier 402 can alleviate the impact caused by the encapsulation 106 formed on the integrated circuit 102 by preventing the material of the encapsulation 106 on to the inactive side 212. As a result, the reduction of the stress to the integrated circuit 102 can improve board level reliability and performance of the semiconductor device.

Figure 7:
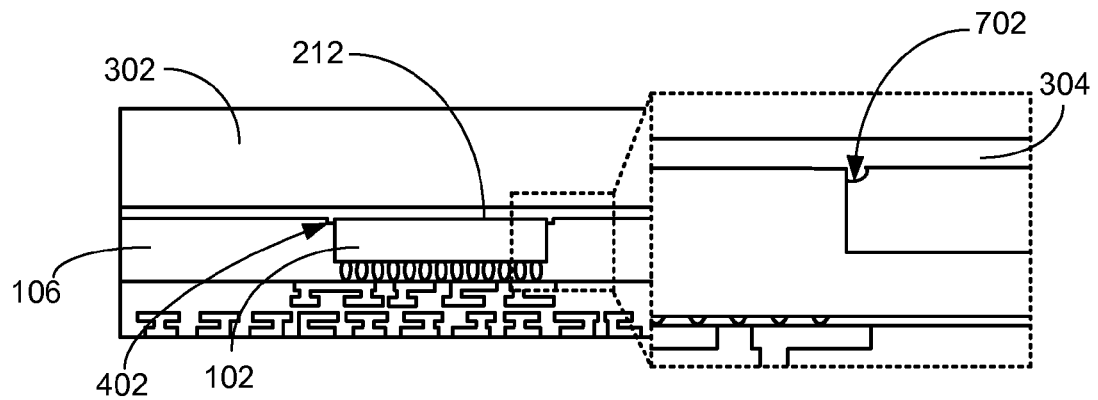
FIG. 7 is an expanded view of the barrier preventing mold flash during the formation of the encapsulation.

Referring now to FIG. 7, therein is shown an expanded view of the barrier 402 of FIG. 6 preventing mold flash during the formation of the encapsulation 106. The expanded view can be illustrated within the dotted lines. For example, the recess surface 112 of FIG. 1 of the recess 110 of FIG. 1 can have an uneven side 702. The uneven side 702 is defined as the side of the encapsulation 106 exposed within the recess 110 after the encapsulation 106 contacting the barrier 402.

When the barrier 402 is formed after the mold chase 302 having the buffer layer 304 being pressed over the inactive side 212 of the integrated circuit 102, the barrier 402 can be formed unevenly. The barrier 402 can be shaped unevenly because the malleability of the step layer 304 of FIG. 3 may not be evenly distributed. When the pressure is applied to the step layer 304, the barrier 402 can be formed with a shape that is not evenly formed around the portion 210 of FIG. 2 of the non-vertical side 208 of FIG. 2. As a result, the recess surface 112 can be the reflection of the unevenly formed shape of the barrier 402. Moreover, the uneven side 702 can be the reflection of the unevenly formed shape of the barrier 402.

Figure 8:
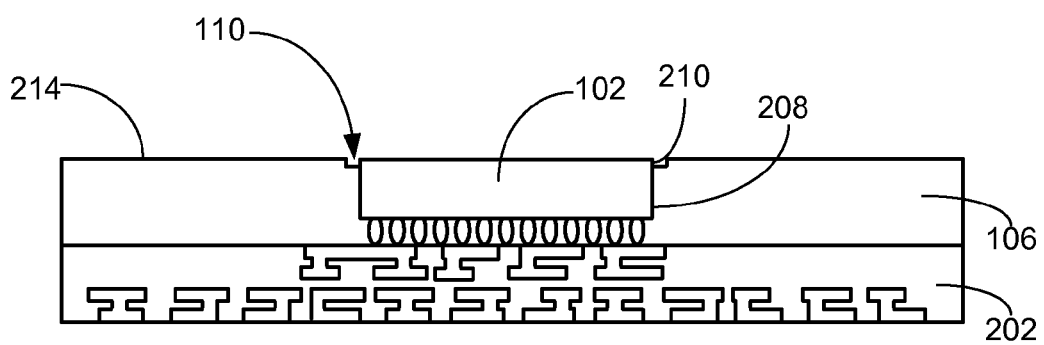
FIG. 8 is a cross-sectional view of the integrated circuit over the substrate for manufacture of the integrated circuit packaging system of FIG. 1 after a release phase of the first manufacture.

Referring now to FIG. 8, therein is shown a cross-sectional view of the integrated circuit 102 over the substrate 202 for manufacture of the integrated circuit packaging system 100 of FIG. 1 after a release phase of the first manufacture. The mold chase 302 of FIG. 3 having the buffer layer 304 of FIG. 3 can be released, leaving the encapsulation 106 having the recess 110 exposing the portion 210 of the non-horizontal side 208 at the topside 214 of the encapsulation 106.

Figure 9:
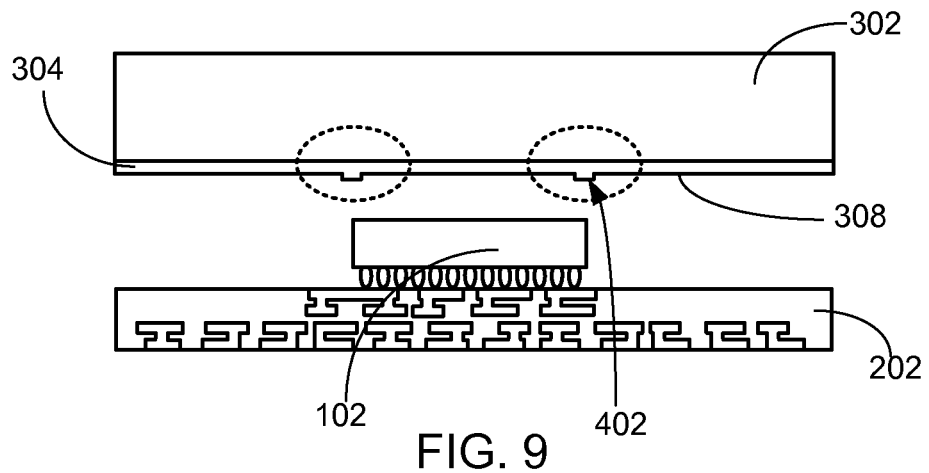
FIG. 9 is a cross-sectional view of the integrated circuit over the substrate for manufacture of the integrated circuit packaging system of FIG. 1 after a mounting phase of the second manufacture.

Referring now to FIG. 9, therein is shown a cross-sectional view of the integrated circuit 102 over the substrate 202 for manufacture of the integrated circuit packaging system 100 of FIG. 1 after a mounting phase of the second manufacture. The second manufacture can represent a variation of a manufacturing process of the integrated circuit packaging system 100 independent from the first manufacture. The mold chase 302 can have the buffer layer 304 with the barrier 402 on the base layer 308 as illustrated within the dotted circle.

It has been further discovered that the manufacture of the integrated circuit packaging system 100 with the mode chase 302 having the buffer layer 304 with the barrier 402 can improve the reliability of the integrated circuit package system 100. As illustrated in FIG. 4, the barrier 402 can be formed when the mode chase 302 presses the step layer 306 of FIG. 3 over the inactive side 212 of FIG. 2. In contrast, the barrier 402 that is premade on the buffer layer 304 can require less pressure to press down to cover the inactive side 212 and the portion 210 of FIG. 2. As a result, the less pressure can lead to avoidance of chipping or cracking of the integrated circuit 102, thus improving the reliability of the integrated circuit package system 100. For further example, the barrier 402 can include a width with an approximate range of 10 to 100 micrometers (um) and a height with an approximate range of 5 to 50 um.

Figure 10:
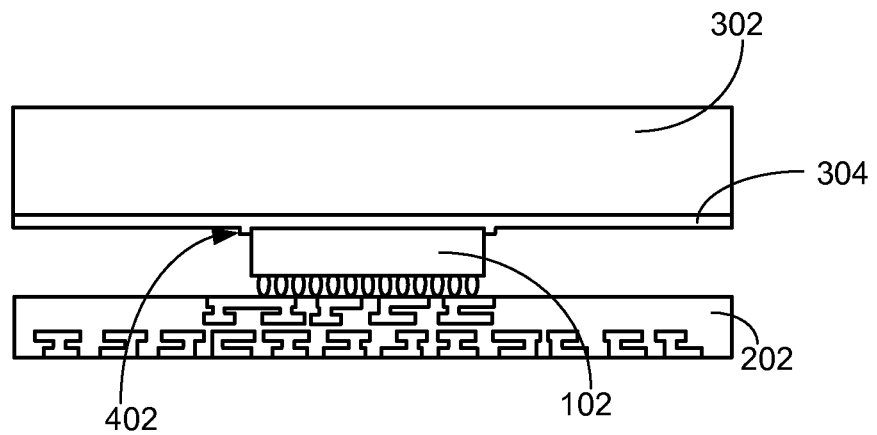
FIG. 10 is a cross-sectional view of the integrated circuit over the substrate for manufacture of the integrated circuit packaging system of FIG. 1 after a mounting phase of the second manufacture.

Referring now to FIG. 10, therein is shown a cross-sectional view of the integrated circuit 102 over the substrate 202 for manufacture of the integrated circuit packaging system 100 of FIG. 1 after a mounting phase of the second manufacture. The mold chase 302 with the buffer layer 304 having the barrier 402 can be mounted over the integrated circuit 102 with the integrated circuit 102 between the barrier 402.

It has been discovered that the manufacture of the integrated circuit packaging system 100 with the mode chase 302 having the buffer layer 304 can reduce the profile of the semiconductor device. The mode chase 302 having the buffer layer 304 can prevent the encapsulation 106 of FIG. 1 over the inactive side 212 of FIG. 2, thus, reducing the profile. As a result, the lower profile allows the ability to stack another device over the integrated circuit packaging system 100, thus, lowering the production cost.

It has been also discovered that the manufacture of the integrated circuit packaging system 100 with the mode chase 302 having the buffer layer 304 can enable the scanning acoustic tomographic inspection easier. The mode chase 302 having the buffer layer 304 can prevent the formation of the encapsulation 106 over the inactive side 212, thus, preventing the formation of an interruption layer over the integrated circuit 102. As a result, the lack of interruption layer allows an easier inspection, thus, lowering the production cost.

Figure 11:
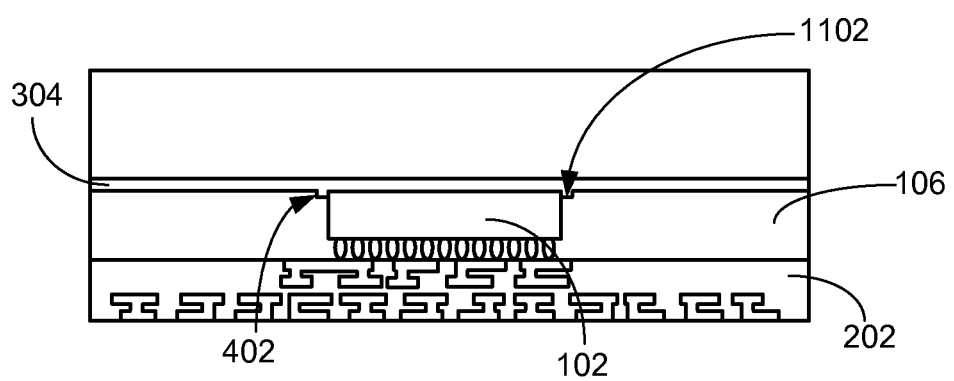
FIG. 11 is a cross-sectional view of the integrated circuit over the substrate for manufacture of the integrated circuit packaging system of FIG. 1 after a mold phase of the second manufacture.

Referring now to FIG. 11, therein is shown a cross-sectional view of the integrated circuit 102 over the substrate 202 for manufacture of the integrated circuit packaging system 100 of FIG. 1 after a mold phase of the second manufacture. The encapsulation 106 can be formed between the substrate 202 and the buffer layer 304. The recess 110 of FIG. 1 of the encapsulation 106 can be formed after the encapsulation 106 contacts the barrier 402.

For example, the recess surface 112 of FIG. 1 of the recess 110 can have an even side 1102. The barrier 402 formed on the buffer layer 304 during the second manufacture can have a shape that is evenly formed. As a result, the recess surface 112 can be the reflection of the evenly formed shape of the barrier 402. Moreover, the even side 1102 can be the reflection of the evenly formed shape of the barrier 402.

It has been discovered that the barrier 402 formed directly contacting the portion 210 of FIG. 1 of the non-horizontal side 208 FIG. 1 of the integrated circuit 102 can prevent mold flash during a formation of the encapsulation 106. More specifically, the barrier 402 can prevent the material of the encapsulation 106 from bleeding over on to the inactive side 212 of the integrated circuit 102.

Further, the prevention of mold flash can improve the reliability by allowing an even formation of the encapsulation 106, resulting in an even heat distribution across the integrated circuit 102 and the encapsulation 106. Additionally, the prevention of mold flash can lead to avoidance of mislabeling of the integrated circuit packaging system 100, as the material of the encapsulation 106 does not smear the inactive side 212 of the integrated circuit 102.

Furthermore, the prevention of the mold flash can improve the reliability of the integrated circuit packaging system 100 by avoiding a contamination of the inactive side 212 of the integrated circuit 102. Other components, such as the heat sink (not shown), can be mounted over the inactive side 212. And the performance of the integrated circuit 102 can be lowered if the heat sink is attached to the inactive side 212 that has been contaminated by the mold flash. As a result, the film assisted molding design of the present invention can be applied to various semiconductors, thus, lowering the production cost.

It has also been discovered that the barrier 402 can reduce the stress on the integrated circuit 102 during the formation of the encapsulation 106. Moreover, the barrier 402 can alleviate the impact caused by the encapsulation 106 formed on the integrated circuit 102 by preventing the material of the encapsulation 106 on to the inactive side 212. As a result, the reduction of the stress to the integrated circuit 102 can improve board level reliability and performance of the semiconductor device.

Figure 12:
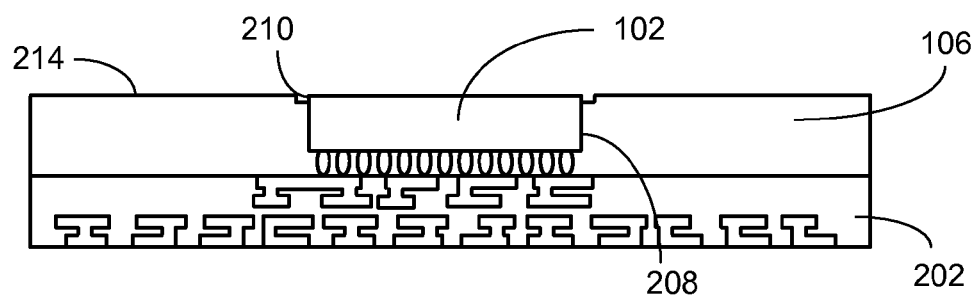
FIG. 12 is a cross-sectional view of the integrated circuit over the substrate for manufacture of the integrated circuit packaging system of FIG. 1 after a release phase of the second manufacture.

Referring now to FIG. 12, therein is shown a cross-sectional view of the integrated circuit 102 over the substrate 202 for manufacture of the integrated circuit packaging system 100 of FIG. 1 after a release phase of the second manufacture. The mold chase 302 (not shown) having the buffer layer 304 (not shown) can be released, leaving the encapsulation 106 having the recess 110 exposing the portion 210 of the non-horizontal side 208 at the topside 214 of the encapsulation 106.

Figure 13:
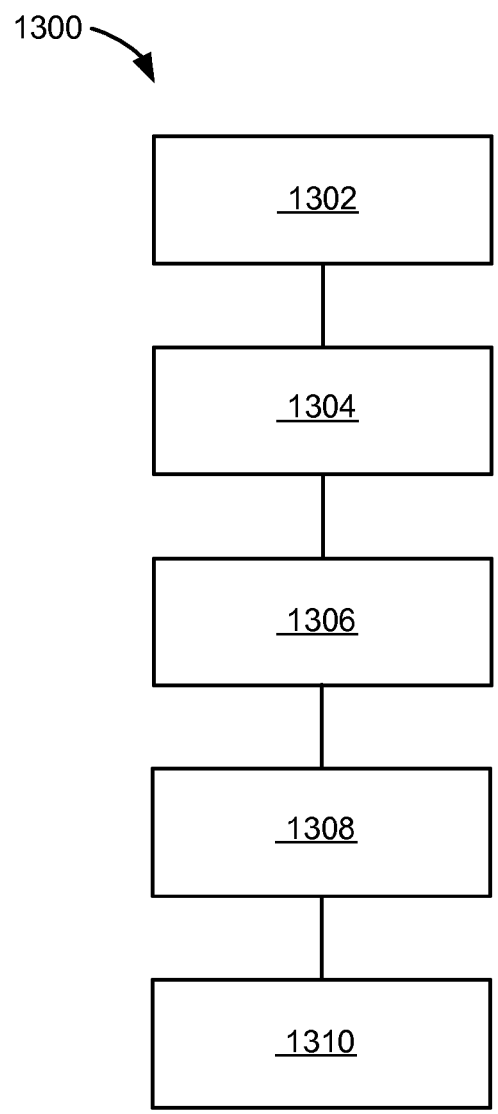
FIG. 13 is a flow chart of a method of manufacture of an integrated circuit packaging system in an embodiment of the present invention.

Referring now to FIG. 13, therein is shown a flow chart of a method 1300 of manufacture of an integrated circuit packaging system in an embodiment of the present invention. The method 1300 includes: providing a substrate in a block 1302; mounting an integrated circuit over the substrate, the integrated circuit having an inactive side and a non-horizontal side in a block 1304; mounting a mold chase having a buffer layer over the integrated circuit in a block 1306; forming an encapsulation between the substrate and the buffer layer in a block 1308; and removing the mold chase, leaving the encapsulation having a recess exposing a portion of the non-horizontal side in a block 1310.

Thus, it has been discovered that the integrated circuit packaging system of the present invention furnishes important and heretofore unknown and unavailable solutions, capabilities, and functional aspects for an integrated circuit packaging system with encapsulation. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   mounting an integrated circuit over the substrate, the integrated circuit having an inactive side and a non-horizontal side;
   mounting a mold chase having a buffer layer over the integrated circuit;
   forming an encapsulation between the substrate and the buffer layer; and
   removing the mold chase, leaving the encapsulation having a recess exposing a portion of the non-horizontal side.

2. The method as claimed in claim 1 wherein mounting the mold chase includes applying the buffer layer having a step layer greater than a surface area of the inactive side.

3. The method as claimed in claim 1 wherein mounting the mold chase includes applying the buffer layer having a barrier, the barrier in a direct contact with the non-horizontal side.

4. The method as claimed in claim 1 wherein removing the mold chase includes removing the mold chase, leaving the encapsulation having the recess surrounding the integrated circuit.

5. The method as claimed in claim 1 wherein removing the mold chase includes removing the mold chase, leaving the encapsulation having the recess at a topside of the encapsulation.

6. A method of manufacture of an integrated circuit packaging system comprising:
   providing a substrate;
   mounting an integrated circuit over the substrate, the integrated circuit having an inactive side and a non-horizontal side;
   mounting a mold chase having a buffer layer over the integrated circuit;
   forming an encapsulation between the substrate and the buffer layer; and
   removing the mold chase, leaving the encapsulation having a recess exposing a portion of the non-horizontal side at a topside of the encapsulation.

7. The method as claimed in claim 6 wherein removing the mold chase includes exposing the inactive side coplanar with the topside.

8. The method as claimed in claim 6 wherein removing the mold chase includes, removing the mold chase, leaving the encapsulation having the recess with a recess surface having an uneven side.

9. The method as claimed in claim 6 wherein removing the mold chase includes, removing the mold chase, leaving the encapsulation having the recess with a recess surface having an even side.

10. The method as claimed in claim 6 wherein mounting the mold chase includes applying the buffer layer having a step layer thicker than a base layer of the buffer layer.

11. An integrated circuit packaging system comprising:
    a substrate;
    an integrated circuit over the substrate, the integrated circuit having an inactive side and a non-horizontal side; and
    an encapsulation on the integrated circuit and the substrate, the encapsulation having a recess exposing a portion of the non-horizontal side.

12. The system as claimed in claim 11 wherein the encapsulation includes the recess surrounding the integrated circuit.

13. The system as claimed in claim 11 wherein the encapsulation includes the recess at a topside of the encapsulation.

14. The system as claimed in claim 11 wherein the encapsulation exposes the inactive side.

15. The system as claimed in claim 11 wherein the encapsulation includes the recess with a recess surface having an uneven side.

16. The system as claimed in claim 11 further comprising a lower active side of the integrated circuit facing the substrate.

17. The system as claimed in claim 16 wherein the encapsulation includes the recess with a recess surface having an even side.

18. The system as claimed in claim 16 wherein the encapsulation includes the topside coplanar with the inactive side.

19. The system as claimed in claim 16 wherein the integrated circuit includes a conductive connector on a lower active side of the integrated circuit.

20. The system as claimed in claim 16 wherein the integrated circuit is a flip chip.

* * * * *